(12) United States Patent
Brandenburg et al.

(10) Patent No.: US 6,905,349 B1
(45) Date of Patent: Jun. 14, 2005

(54) TECHNIQUE FOR CONNECTOR TO PRINTED CIRCUIT BOARD DECOUPLING TO ELIMINATE FLEXURE

(75) Inventors: Scott D. Brandenburg, Kokomo, IN (US); David A. Laudick, Kokomo, IN (US); Thomas A. Degenkolb, Noblesville, IN (US); Larry M Mandel, Noblesville, IN (US); Richard D. Parker, Tipton, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/784,350

(22) Filed: Feb. 23, 2004

(51) Int. Cl.[7] .............................................. H01R 12/00
(52) U.S. Cl. ......................................................... 439/79
(58) Field of Search ........................... 439/79, 144, 59, 439/76.1; 29/841, 264, 829–832; 361/658, 736, 796

(56) References Cited

U.S. PATENT DOCUMENTS

| | | | | |
|---|---|---|---|---|
| 5,699,235 A | * | 12/1997 | Tsurumiya et al. | 361/803 |
| 6,572,412 B2 | * | 6/2003 | Beuther et al. | 439/620 |
| 6,733,306 B2 | * | 5/2004 | Kane et al. | 439/79 |
| 6,807,731 B2 | * | 10/2004 | Brandenburg et al. | 29/841 |
| 6,821,135 B1 | * | 11/2004 | Martin | 439/144 |

* cited by examiner

Primary Examiner—Michael C. Zarroli
(74) Attorney, Agent, or Firm—Stefan V. Chmielewski

(57) ABSTRACT

An electronic assembly and/or a mold is constructed to reduce deflection and resultant damage to components and/or an associated printed circuit board of the electronic assembly when the electronic assembly is overmolded.

14 Claims, 3 Drawing Sheets

TECHNIQUE FOR CONNECTOR TO PRINTED CIRCUIT BOARD DECOUPLING TO ELIMINATE FLEXURE

TECHNICAL FIELD

The present invention is generally directed to a technique for connector to printed circuit board (PCB) decoupling to eliminate PCB flexure and, more specifically, to a technique for connector to PCB decoupling to eliminate PCB flexure in an overmolded electronic assembly.

BACKGROUND OF THE INVENTION

Today, overmolded electronic assemblies are being increasingly utilized in situations where an electronic assembly is subject to environmental conditions. In a typical overmolded electronic assembly, a mold is utilized that closes on multiple surfaces, at least one of which may include a printed circuit board (PCB), of a product. In electronic assemblies that implement heat sink backplates, it is typical for one portion of the mold to close on a back surface of the heat sink backplate and another portion of the mold to close on a portion of an electrical connector associated with a PCB. It should be appreciated that the molding clamp cycle may cause damage to an electronic assembly to be overmolded, as a typical press that clamps portions of the mold together provides a force in the range of sixty to one-hundred twenty tons. As such, any difference in the dimensions of the electronic assembly and the mold may result in compound leakage if the assembly is too thin or crushing or displacement of the assembly, or a portion of the assembly, when the assembly is too thick.

It should be appreciated that an electronic assembly to be overmolded may exhibit tolerance stack-ups associated with the assembly's backplate, PCB and connector shroud. In an exemplary process, when the mold closes on the electronic assembly, the associated PCB may be deflected which can result in damage to the electronic assembly. For example, when the PCB includes flip-chips whose back surfaces are thermally coupled to the backplate, the deflection can be transmitted to fragile non-underfilled solder joints of the flip-chip, resulting in cracked and/or smashed bumps and, thus, damaging the electronic assembly and/or reducing the life of the electronic assembly.

What is needed is a technique to decouple movement of a connector that is electrically coupled to a printed circuit board (PCB), during overmolding of an electronic assembly, such that movement of the connector does not result in flexure of the PCB and resultant damage to the electronic assembly.

SUMMARY OF THE INVENTION

The present invention is directed to an overmolded electronic assembly and techniques for overmolding the electronic assembly that reduce deflection and resultant damage to components and/or a printed circuit board (PCB) of the electronic assembly.

According to one embodiment of the present invention, a technique for overmolding an electronic assembly includes a number of steps. Initially, an electronic assembly is provided that includes a printed circuit board (PCB) that has at least one associated electronic component electrically coupled to the PCB and at least one associated electrical connector electrically coupled to the PCB. The connector includes a connector shroud and the electronic assembly includes a backplate with at least a portion of the PCB engaging the backplate and the at least one associated electronic component of the PCB being in thermal contact with the backplate. The electronic assembly is placed within the mold and the mold is closed on the electronic assembly such that a first portion of the mold engages the backplate of the electronic assembly and a second portion of the mold sealingly engages the at least one associated connector such that the PCB is not deflected. Finally, a molding material is inserted into the mold such that the electronic assembly is overmolded.

According to one embodiment of the present invention, the mold is a two-piece mold. According to another embodiment of the present invention, the connector shroud includes a lip that sealingly engages the second portion of the mold with the lip being configured to deform to prevent a force, imparted from the second portion of the mold to the connector, from deflecting the PCB. According to another aspect of the present invention, the connector includes a slip ring that is interference fit to the connector shroud and sealingly engages the second portion of the mold. In this embodiment, the slip ring is configured to slide along a body of the connector during the clamping process to allow for tolerance stackup and to prevent a force, imparted from the second portion of the mold to the connector, from deflecting the PCB.

According to yet another embodiment of the present invention, the connector is electrically coupled to the PCB via a flexible circuit to prevent a force, imparted from the second portion of the mold to the connector, from deflecting the PCB. According to still another aspect of the present invention, the second portion of the mold includes a seal that sealingly engages the connector, with the seal being configured to deform to prevent a force, imparted from the second portion of the mold to the connector, from deflecting the PCB.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

The present invention is directed to a variety of techniques for sealing a top surface of a mold to a printed circuit board (PCB) without transmitting stresses to the PCB that is positioned within the mold.

According to the present invention, electronic assemblies overmolded according to the techniques described herein have higher yields as flip-chip and other surface-mounted type devices electrically coupled to the PCB are not damaged by the mold during the overmolding process. Further, overmolding, according to the present invention, prevents damage to copper signal traces on a printed circuit board (PCB) associated with the electronic assembly. Broadly, many of the techniques disclosed herein eliminate flexure (deflection) by decoupling a connector associated with a printed circuit board (PCB) and, thus, prevent the forces imparted by a mold from being transmitted to a PCB during a press clamp cycle.

Figure 1A:
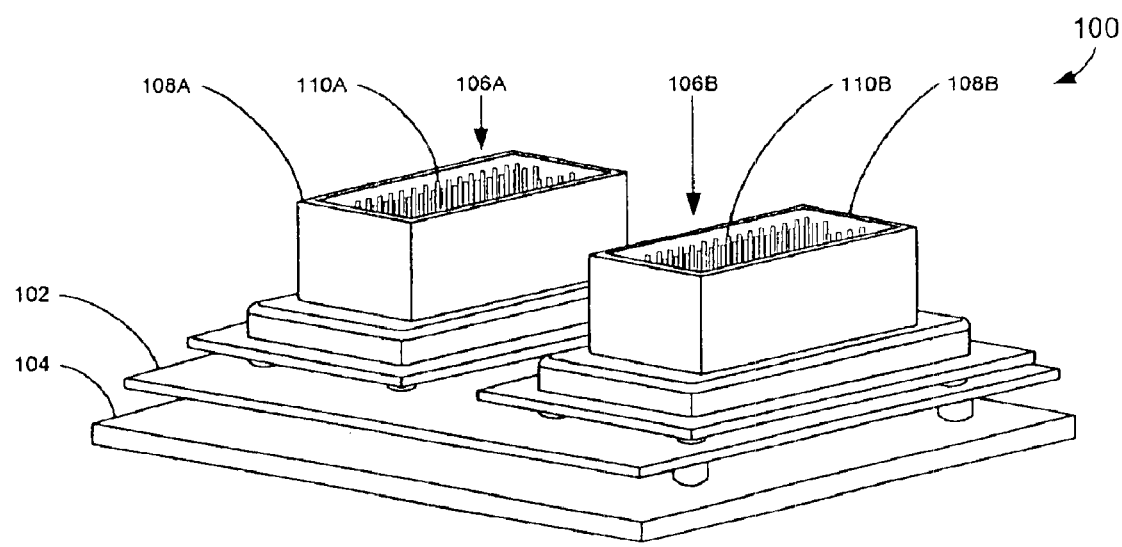
FIG. 1A is a perspective view of an electronic assembly designed according to one embodiment of the present invention, prior to overmolding.
Figure 1B:
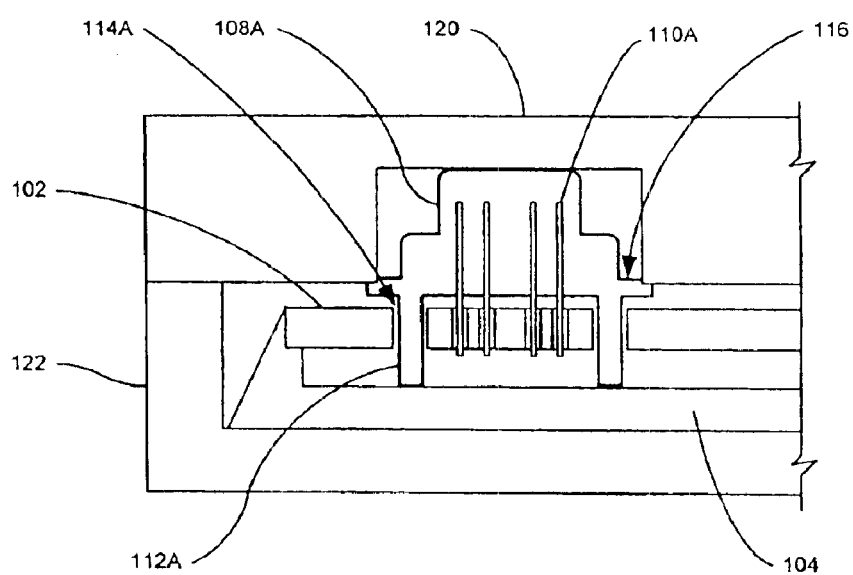
FIG. 1B is a cross-sectional view of a portion of the electronic assembly of FIG. 1A located within a mold.

With reference to FIG. 1A, an electronic assembly 100 is depicted that includes a printed circuit board (PCB) 102, which includes one or more associated electronic components whose surfaces are in thermal contact with a backplate 104, prior to overmolding. As is shown, a pair of connectors 106A and 106B are utilized to transfer signals to/from the PCB 102 and an external system or subsystem for further processing. Connector shrouds 108A and 108B protect pins 110A and 110B, respectively, of the connectors 106A and 106B. As is better shown in FIG. 1B, the shroud 108A, which encloses pin 110A, includes a plurality of connector legs 112A that extend through apertures 114A formed in the PCB 102 and a resilient lip 116. The legs 112A support the connector body such that, when a top mold 120 is brought into contact with a bottom mold 122, the PCB 102 is not deflected. As the connector shroud 108A is physically decoupled from the PCB 102 by the lip 116, the force transmitted from the top mold 120 to the connector shroud 108A is not transmitted to the PCB 102 and, as such, deflection of the PCB 102 is avoided. It should be appreciated that, in this context, the lip 116 of the connector shroud 108A may be made of a wide variety of resilient materials. In sum, as the top mold 120 comes in contact with the lip 116 of the connector shroud 108A, the lip 116 is compressed, as required, to prevent the PCB 102 from deflecting and, thus, being damaged or having solder joints of electronic components coupled to the PCB from being damaged.

Figure 2A:
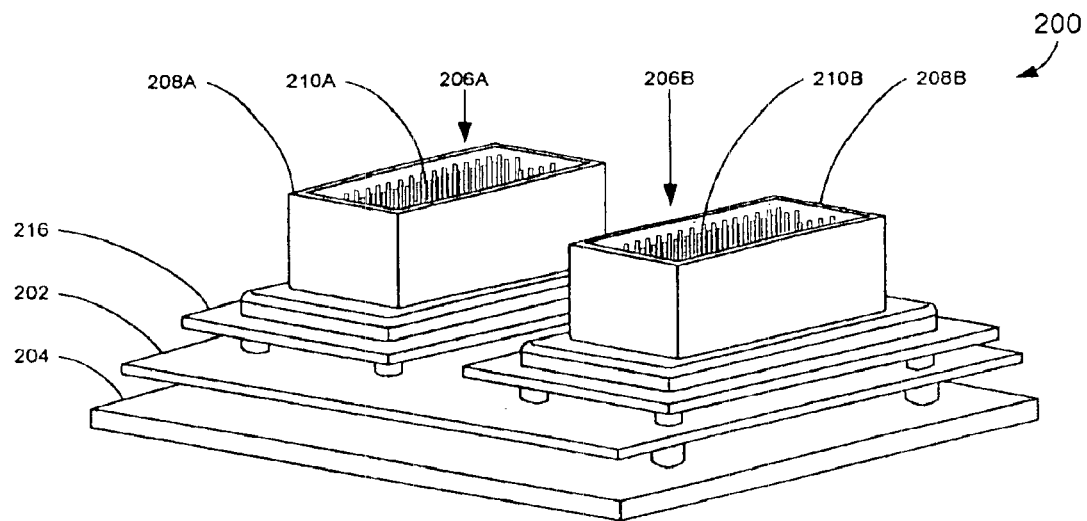
FIG. 2A is a perspective view of another electronic assembly constructed according to another aspect of the present invention.
Figure 2B:
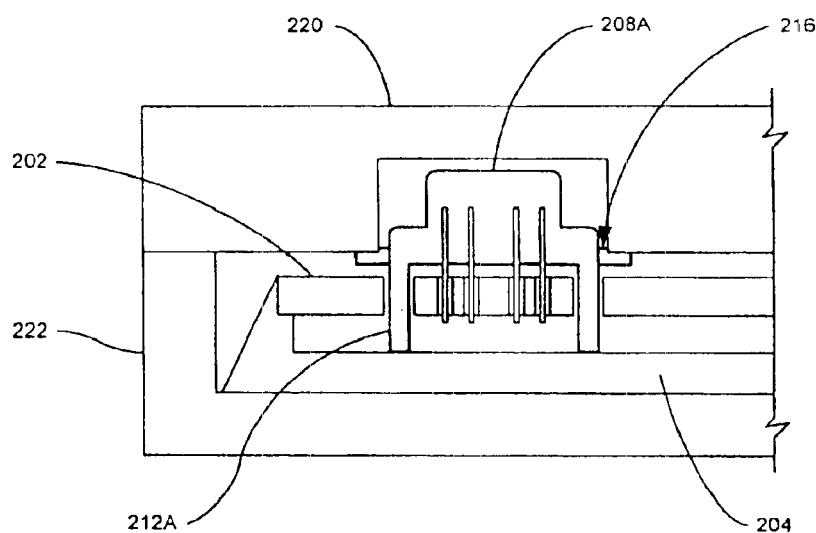
FIG. 2B is a cross-sectional view of a portion of the electronic assembly of FIG. 2A located within a mold.

With reference to FIGS. 2A and 2B, another electronic assembly 200 is shown prior to overmolding. The electronic assembly 200 is similar to the electronic assembly 100 of FIGS. 1A and 1B, with the exception that the lip 116 of the electronic assembly 100 has been replaced with a slip ring 216, which is interference fit to an outer portion, i.e., a body, of the connector shroud 208A. The slip ring 216 seals to a surface of top mold 220 and prevents leakage of molding compound introduced into a cavity defined by the top mold 220 and bottom mold 222. As with the assembly 100 of FIGS. 1A and 1B, the shroud 208A of the assembly 200 of FIGS. 2A and 2B includes connector legs 212A that extend through apertures in PCB 202 and support the connector body to prevent a force, imparted from the mold to the connector, from deflecting the PCB 202.

Figure 3:
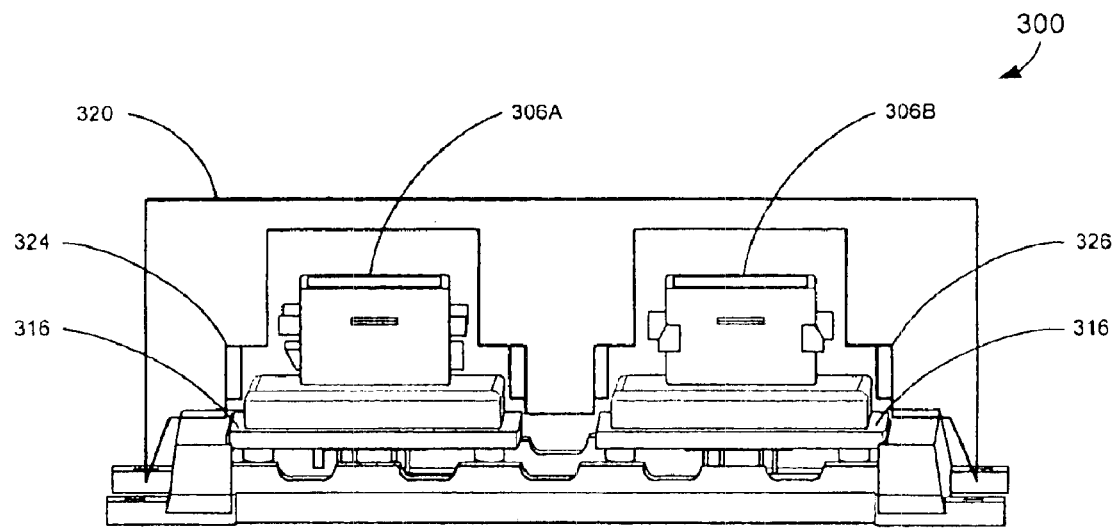
FIG. 3 is a perspective view of a cross-sectioned top mold, including an electronic assembly, that details the positioning of seals within the top mold.

FIG. 3 shows an electronic assembly 300 in a perspective view with a top mold 320 cross-sectioned. As is shown, the top mold 320 includes seals 324 and 326 that seal onto a lip 316 of connector shrouds 306A and 306B, respectively. The seals 324 and 326 may be made of a variety of material, such as a silicone rubberized gasket, integrated with the top mold 320, and are located at a clamp area where the top mold 320 engages the lip 316 of the connector shrouds 306A and 306B, respectively. The seals 324 and 326 compress during the mold clamp cycle to prevent a force from the top mold 320 from being applied to the PCB (not shown).

Figure 4:
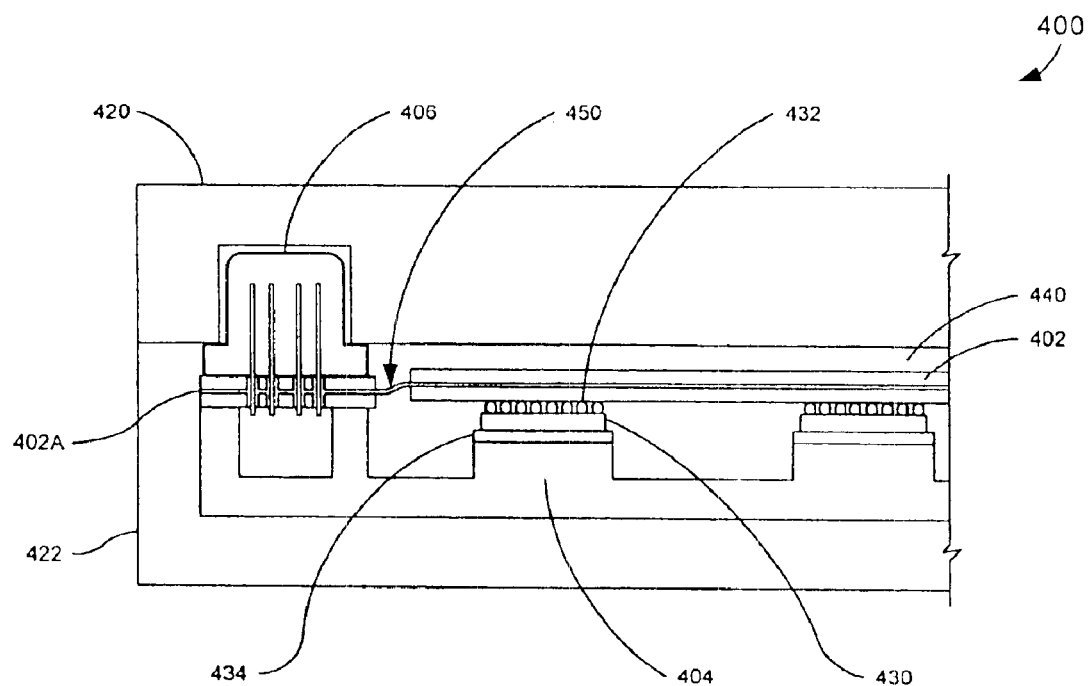
FIG. 4 is a cross-sectional view of an electronic assembly constructed according to another aspect of the present invention located within a mold.

With reference to FIG. 4, an electronic assembly 400 is shown that is overmolded with a molding compound 440 contained within a top mold 420 and a bottom mold 422. As is shown in FIG. 4, a flip-chip 430 includes a number of solder bumps 432 that electrically couple the flip-chip 430 to a printed circuit board (PCB) 402. A thermally conductive material 434 is located between a portion of the backplate 404 and a back surface of the flip-chip 430. A flexible circuit 450 is used to electrically couple connector 406 and its associated PCB 402A to the PCB 402. Thus, the assembly 400 includes a connector area that is decoupled from the PCB 402 and, thus, the connector 406 can flex without transmitting a force to the PCB 402 that includes chips 430 mounted thereon. The flexible circuit 450 may be, for example, made of a thin FR4 core material and/or a polyimide, among other materials.

Accordingly, a number of techniques have been described herein that advantageously allow a printed circuit board (PCB) of an electronic assembly to be physically decoupled from movement of an associated connector during an overmolding process. Such techniques are particularly advantageous when implemented to overmold electronic assemblies utilized in automotive environments.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

What is claimed is:

1. A method for over-molding an electronic assembly, comprising the steps of:

providing a mold;

providing an electronic assembly, the electronic assembly comprising:

a printed circuit board (PCB) including at least one associated electronic component electrically coupled to the PCB and at least one associated electrical connector electrically coupled to the PCB, the connector including a connector shroud; and a backplate, wherein at least a portion of the PCB engages the backplate and the at least one associated electronic component is in thermal contact with the backplate; and placing the electronic assembly within the mold;

closing the mold on the electronic assembly, wherein a first portion of the mold engages the backplate of the electronic assembly and a second portion of the mold sealingly engages the connector shroud of the at least one associated connector which is designed to deflect such that the PCB is not deflected; and inserting a mold material into the mold, whereby the electronic assembly is over-molded.

2. The method of claim 1, wherein the mold is a two-piece mold.

3. The method of claim 1, wherein the connector shroud includes a lip that sealingly engages the second portion of the mold, and wherein the lip is configured to deform to prevent a force imparted from the second portion of the mold to the connector from deflecting the PCB.

4. The method of claim 1, wherein the connector includes a slip ring that is interference fit to the connector shroud and sealingly engages the second portion of the mold and slides along a body of the connector to prevent a force imparted from the second portion of the mold to the connector from deflecting the PCB.

5. The method of claim 1, wherein the second portion of the mold includes a seal that sealingly engages the connector, and wherein the seal is configured to deform to prevent a force imparted from the second portion of the mold to the connector from deflecting the PCB.

6. The method of claim 1, wherein the connector is electrically coupled to the PCB by a flexible circuit that prevents a force imparted from the second portion of the mold to the connector from deflecting the PCB.

7. An over-molded electronic assembly, comprising:
   a printed circuit board (PCB) including at least one associated electronic component electrically coupled to the PCB and at least one associated connector electrically coupled to the PCB, the connector including a connector shroud;
   a backplate, wherein at least a portion of the PCB engages the backplate and the at least one associated electronic component is in thermal contact with the backplate, wherein a portion of the connector shroud includes a lip that sealingly engages a portion of a mold during over-molding, and wherein the lip is configured to prevent a force imparted from the mold to the connector from deflecting the PCB during over-molding; and
   a mold material environmentally sealing the PCB and the at least one associated electronic component.

8. The assembly of claim 7, wherein the lip is a slip ring that is interference fit to the connector shroud and sealingly engages the mold during over-molding, and wherein the slip ring slides along a body of the connector to prevent a force imparted from the mold from deflecting the PCB.

9. An over-molded electronic assembly, comprising:
   a printed circuit board (PCB) including at least one associated electronic component electrically coupled to the PCB and at least one associated connector electrically coupled to the PCB, the connector including a connector shroud;
   a backplate, wherein at least a portion of the PCB engages the backplate and the at least one associated electronic component is in thermal contact with the backplate, wherein a portion of the connector shroud includes a lip that sealingly engages a portion of a mold during over-molding;
   a flexible circuit electrically coupling the connector to the PCB, wherein the flexible circuit prevents a force imparted from the mold to the connector during over-molding from deflecting the PCB; and
   a mold material environmentally sealing the PCB, the flexible circuit and the at least one associated electronic component.

10. A method for over-molding an electronic assembly, comprising the steps of:
    providing a two-piece mold;
    providing an electronic assembly, the electronic assembly comprising:
       a printed circuit board (PCB) including at least one associated electronic component electrically coupled to the PCB and at least one associated electrical connector electrically coupled to the PCB, the connector including a connector shroud; and
       a backplate, wherein at least a portion of the PCB engages the backplate and the at least one associated electronic component is in thermal contact with the backplate; and
    placing the electronic assembly within the mold;
    closing the mold on the electronic assembly, wherein a first portion of the mold engages the backplate of the electronic assembly and a second portion of the mold sealingly engages the at least one associated connector such that the PCB is not deflected; and
    inserting a mold material into the mold, whereby the electronic assembly is over-molded.

11. The method of claim 10, wherein the connector shroud includes a lip that sealingly engages the second portion of the mold, and wherein the lip is configured to deform to prevent a force imparted from the second portion of the mold to the connector from deflecting the PCB.

12. The method of claim 10, wherein the connector includes a slip ring that is interference fit to the connector shroud and sealingly engages the second portion of the mold, and wherein the slip ring slides along a body of the connector to prevent a force imparted from the second portion of the mold to the connector from deflecting the PCB.

13. The method of claim 10, wherein the second portion of the mold includes a seal that sealingly engages the connector, and wherein the seal is configured to deform to prevent a force imparted from the second portion of the mold to the connector from deflecting the PCB.

14. The method of claim 10, wherein the connector is electrically coupled to the PCB by a flexible circuit that prevents a force imparted from the second portion of the mold to the connector from deflecting the PCB.

* * * * *